United States Patent
Kajita

(10) Patent No.: US 8,018,240 B2
(45) Date of Patent: Sep. 13, 2011

(54) APPARATUS, CIRCUIT AND METHOD OF MONITORING LEAKAGE CURRENT CHARACTERISTICS

(75) Inventor: Mikihiro Kajita, Tokyo (JP)

(73) Assignee: NEC Corporation, Tokyo (JP)

( * ) Notice: Subject to any disclaimer, the term of this patent is extended or adjusted under 35 U.S.C. 154(b) by 184 days.

(21) Appl. No.: 12/318,799

(22) Filed: Jan. 8, 2009

(65) Prior Publication Data
US 2009/0201011 A1 Aug. 13, 2009

(30) Foreign Application Priority Data
Feb. 12, 2008 (JP) ................... 2008-030701

(51) Int. Cl.
*G01R 31/3187* (2006.01)
(52) U.S. Cl. ............... 324/750.3; 324/522; 327/108; 327/544
(58) Field of Classification Search .......... 324/763
See application file for complete search history.

(56) References Cited

U.S. PATENT DOCUMENTS

| | | | |
|---|---|---|---|
| 5,459,402 A | 10/1995 | Ueno et al. | |
| 6,806,726 B2 * | 10/2004 | Okada et al. | 324/762.09 |
| 6,963,194 B2 * | 11/2005 | Wu | 324/76.11 |
| 6,992,942 B2 * | 1/2006 | Ito | 365/222 |
| 7,148,755 B2 | 12/2006 | Naffziger et al. | |
| 7,183,862 B2 * | 2/2007 | Takase | 331/17 |
| 7,250,807 B1 * | 7/2007 | Doyle | 327/534 |
| 2005/0062507 A1 | 3/2005 | Naffziger et al. | |
| 2006/0186946 A1 * | 8/2006 | Hughes | 327/427 |

FOREIGN PATENT DOCUMENTS

| | | |
|---|---|---|
| JP | 61-41976 | 2/1986 |
| JP | 1-197673 | 8/1989 |
| JP | 6-118122 | 4/1994 |
| JP | 7-20204 | 1/1995 |
| JP | 2005-73494 | 3/2005 |

* cited by examiner

*Primary Examiner* — Vinh P Nguyen
*Assistant Examiner* — Richard Isla Rodas
(74) *Attorney, Agent, or Firm* — McGinn IP Law Group, PLLC

(57) ABSTRACT

An apparatus includes a current source, a current monitor circuit which monitors a current amount of the current source, and outputs a current amount signal corresponding to the current amount being monitored, a counter circuit which counts a count value based on the current amount signal, the count value corresponding to a period being taken until when the current amount reaches a predetermined value, and a control circuit which modifies an operation parameter for operating a circuit unit according to the count value.

6 Claims, 12 Drawing Sheets

Fig. 6

| COUNTER VALUE:C | C≦10 | 10<C≦100 | 100<C≦500 | 500<C≦1000 | C>1000 |
|---|---|---|---|---|---|
| POWER SUPPLY VOLTAGE | 0.85V | 0.9V | 0.93V | 0.96V | 1.0V |

POWER SUPPLY VOLTAGE : 1.0V BEING Normal

US 8,018,240 B2

APPARATUS, CIRCUIT AND METHOD OF MONITORING LEAKAGE CURRENT CHARACTERISTICS

INCORPORATION BY REFERENCE

This application is based upon and claims the benefit of priority from Japanese patent application No. 2008-030701, filed on Feb. 12, 2008, the disclosure of which is incorporated herein in its entirety by reference.

BACKGROUND OF THE INVENTION

1. Field of the Invention

The present invention relates to a monitor circuit and relates, in particular, to technology of controlling a resource (such as a power supply voltage and a clock frequency, for example) with a monitor circuit to reduce power consumption.

2. Description of Related Art

Scaling down a semiconductor integrated circuit and increasing its integration level may increase the power consumption. The increase of the power consumption in the semiconductor integrated circuit may increase a temperature of the semiconductor integrated circuit. The increase of the temperature may decrease the life of elements of the semiconductor integrated circuit. The decrease in the life of the elements leads to a decreasing reliability of an apparatus including the semiconductor integrated circuit. The increase of the power consumption of the semiconductor integrated circuit may impose a problem that the required power may approach the limit of a power supply facility owned by a customer. Therefore, there may be a need for reducing the power consumption in the semiconductor integrated circuit.

As a technique for reducing the LSI power consumption, technology of halting or delaying a logic circuit which does not need to operate, such as a clock gating or a data gating, is known. However, as a speed and performance is increased in an LSI (Large Scale Integrated circuit), such techniques may not restrain the increasing power consumption when the clock frequency is increased or a multicore is adopted in the processor.

FIGS. 1 and 2 are block diagrams illustrating circuits of a related art for restraining the increasing power consumption. The circuits shown in FIG. 1 are configured based on DVFS (Dynamic Voltage Frequency Scaling) to monitor a power supply drop and a temperature change, and adjust the power supply voltage and the frequency of the LSI. The operation of the LSI is changed dynamically and flexibly so that the monitored power supply drop and temperature change do not reach a limit amount. Thereby, the power consumption does not exceed a critical value.

Performance monitors are arranged in a circuit shown in FIG. 2. Based on the performance monitors, the system is controlled corresponding to a performance monitored by the performance monitors. The performance monitors monitor the performance by checking whether FFs (Flip Flops) mutually latch a correct data.

As technology for monitoring a delay time of a semiconductor integrated circuit, for example, technology disclosed in Patent Document 1 (Japanese Patent Laid-Open No. 61-041976) is known. FIG. 3 is a circuit diagram illustrating a ring oscillator circuit disclosed in Patent Document 1. The technology disclosed in Patent Document 1 includes a ring oscillator and a measurement circuit for measuring an oscillation frequency of the ring oscillator. The circuit shown in FIG. 3 monitors the delay time by inspecting effective bits obtained by the measurement circuit. Besides the above described technology, technology for reducing the power consumption of the semiconductor integrated circuit is known (see, for example, Patent Documents 2 to 5).

[Patent Document 1] Japanese Patent Laid-Open No. 61-041976
[Patent Document 2] Japanese Patent Laid-Open No. 2005-073494
[Patent Document 3] Japanese Patent Laid-Open No. 01-197673
[Patent Document 4] Japanese Patent Laid-Open No. 06-118122
[Patent Document 5] Japanese Patent Laid-Open No. 07-020204

SUMMARY OF THE INVENTION

According to one exemplary aspect of the present invention, an apparatus includes a current source, a current monitor circuit which monitors a current amount of the current source, and outputs a current amount signal corresponding to the current amount being monitored, a counter circuit which counts a count value based on the current amount signal, the count value corresponding to a period being taken until when the current amount reaches a predetermined value, and a control circuit which modifies an operation parameter for operating a circuit unit according to the count value.

According to another exemplary aspect of the present invention, a circuit includes a current source, a current monitor circuit which monitors a current amount of the current source, and outputs a current amount signal corresponding to the current amount being monitored, a counter circuit which counts a count value based on the current amount signal, the count value corresponding to a period being taken until when the current amount reaches a predetermined value, and a control circuit which modifies an operation parameter for operating a circuit unit according to the count value.

According to yet another exemplary aspect of the present invention, a method includes monitoring a current amount of a current source, outputting a current amount signal corresponding to the current amount being monitored, counting a count value based on the current amount signal, the count value corresponding to a period being taken until when the current amount reaches a predetermined value, and modifying an operation parameter for operating a circuit unit according to the count value.

BRIEF DESCRIPTION OF THE DRAWINGS

Other exemplary aspects and advantages of the invention will be made more apparent by the following detailed description and the accompanying drawings, wherein:

FIG. 6 is an example of a table 3 of the present invention.

DETAILED DESCRIPTION OF THE EXEMPLARY EMBODIMENTS

In the related arts disclosed in Patent Documents 1 to 5, it is difficult to monitor the LSI in a relatively small circuit area in a simple manner. In addition, since the circuits such as FFs (Flip Flops) are used to monitor the delay, there arises a problem that it is difficult to adjust a timing of the FFs in designing the monitor circuit.

However, according to the present invention, a circuit area for a monitor circuit may be decreased. In addition, the monitor circuit may be usable at the time of an LSI test.

A leak current is a physical quantity which is sensitive to a variation of a semiconductor process. For example, in the case of a transistor with a slow process level, the leak current amount may decrease while the leak current amount may increase in the case of a transistor with a fast process. In other words, the semiconductor process of the transistor with the fast process is more refined than the transistor with the slow process. The present invention may monitor the process level of a chip or circuit units of the chip by monitoring the leak current to control the power supply voltage and clock frequency. Therefore, the power consumption may be reduced.

In the present invention, an optimum resource (such as an optimum power supply voltage or an optimum clock frequency) may be defined for each of the circuit units or the chip. Therefore, the power consumption may be reduced since a margin for the variation of the semiconductor process may be optimized. In other words, a margin of the power supply voltage or the clock frequency needed for the variation of the semiconductor process may be optimized. In addition, since the circuit size of the monitor circuit is small, the monitor circuit may be installed in a small area. Therefore, disadvantages caused by a power increase accompanied by an area increase and addition of a circuit may be reduced in the present invention.

1. First Exemplary Embodiment

Figure 1:
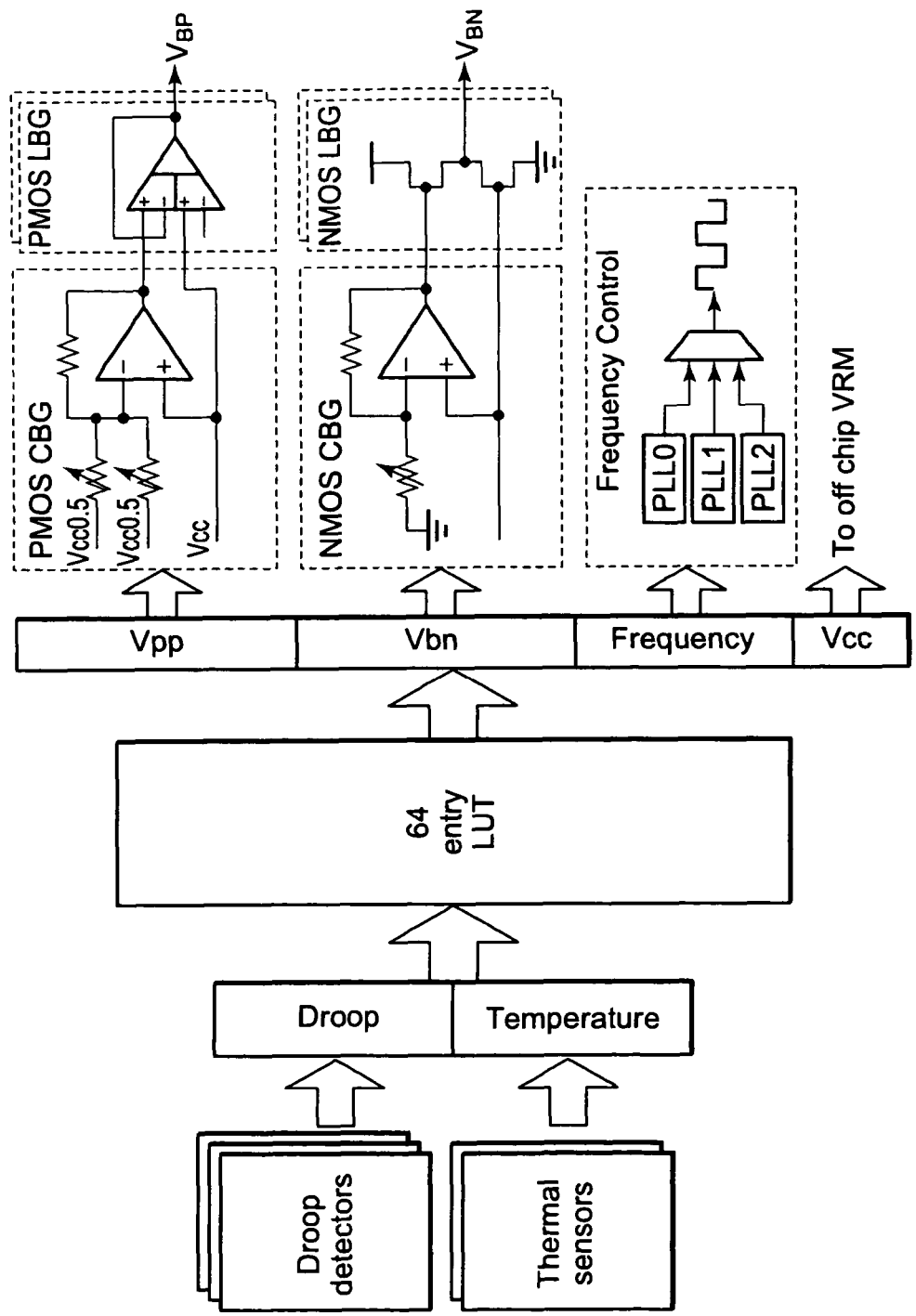
FIG. 1 is a block diagram of a circuit of the related art.
Figure 2:
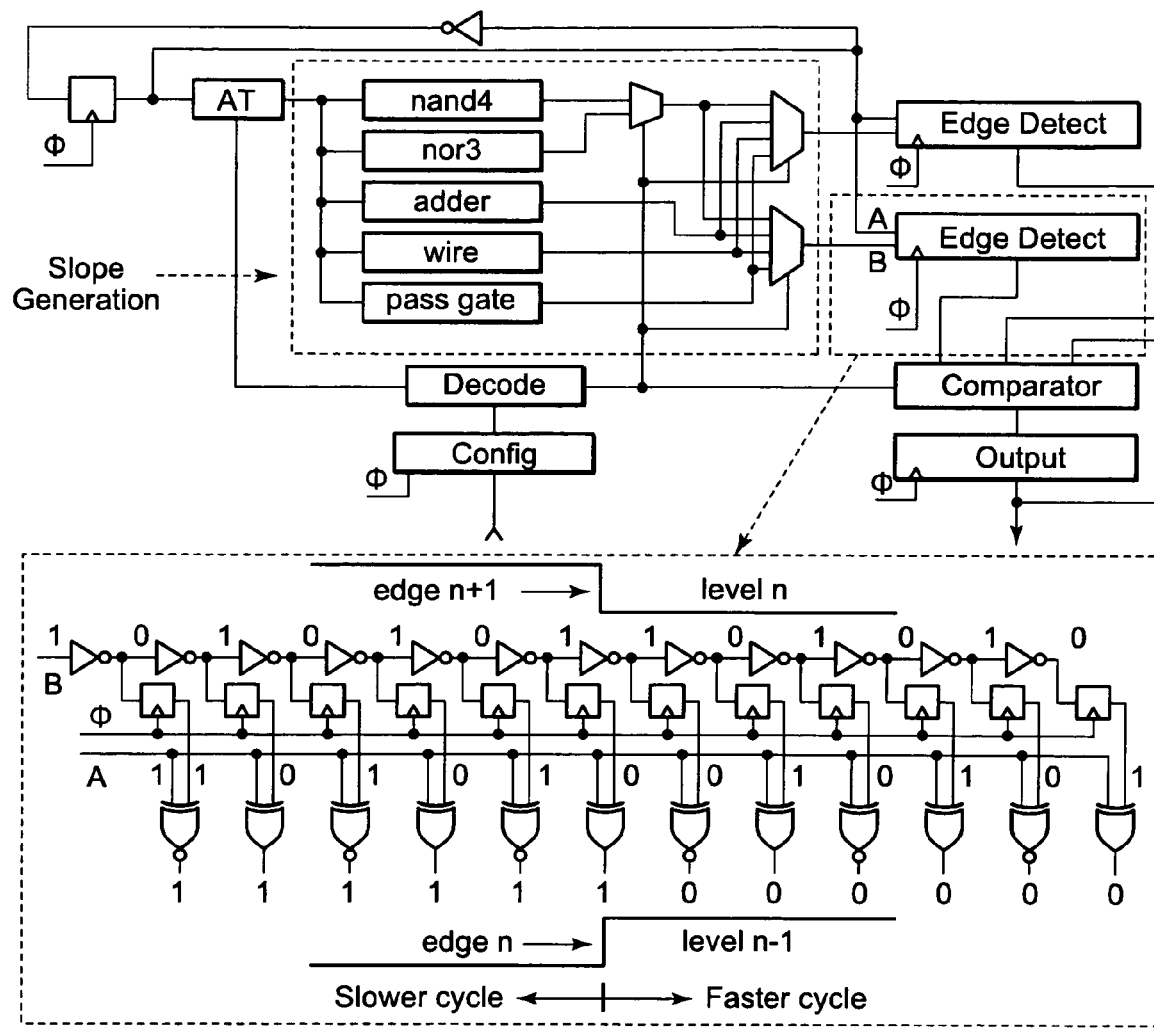
FIG. 2 is a block diagram of a circuit of the related art.
Figure 3:
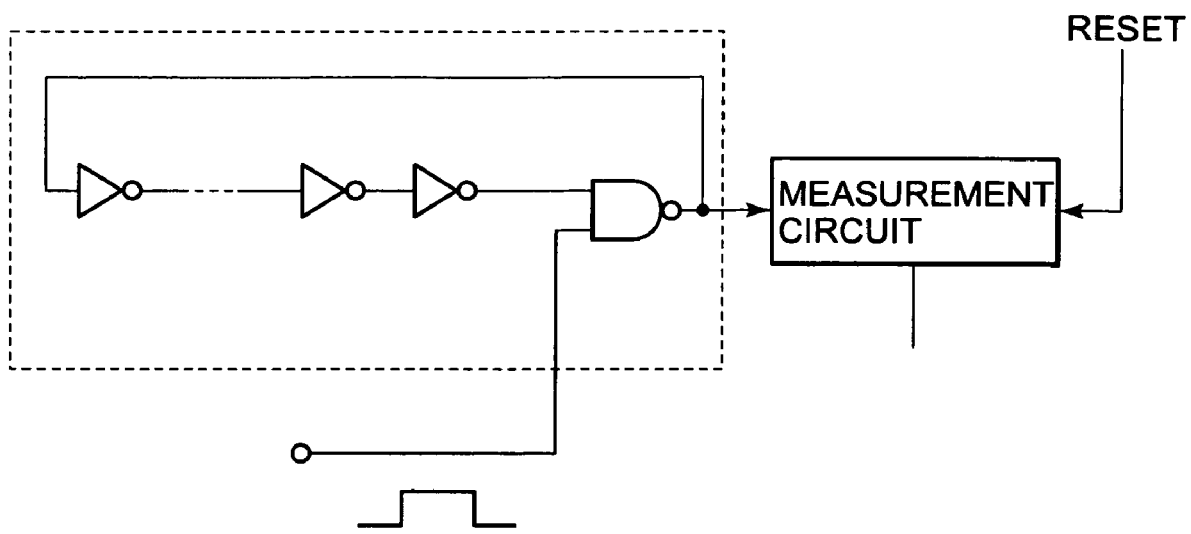
FIG. 3 is a clock diagram of a circuit of the related art.
Figure 4:
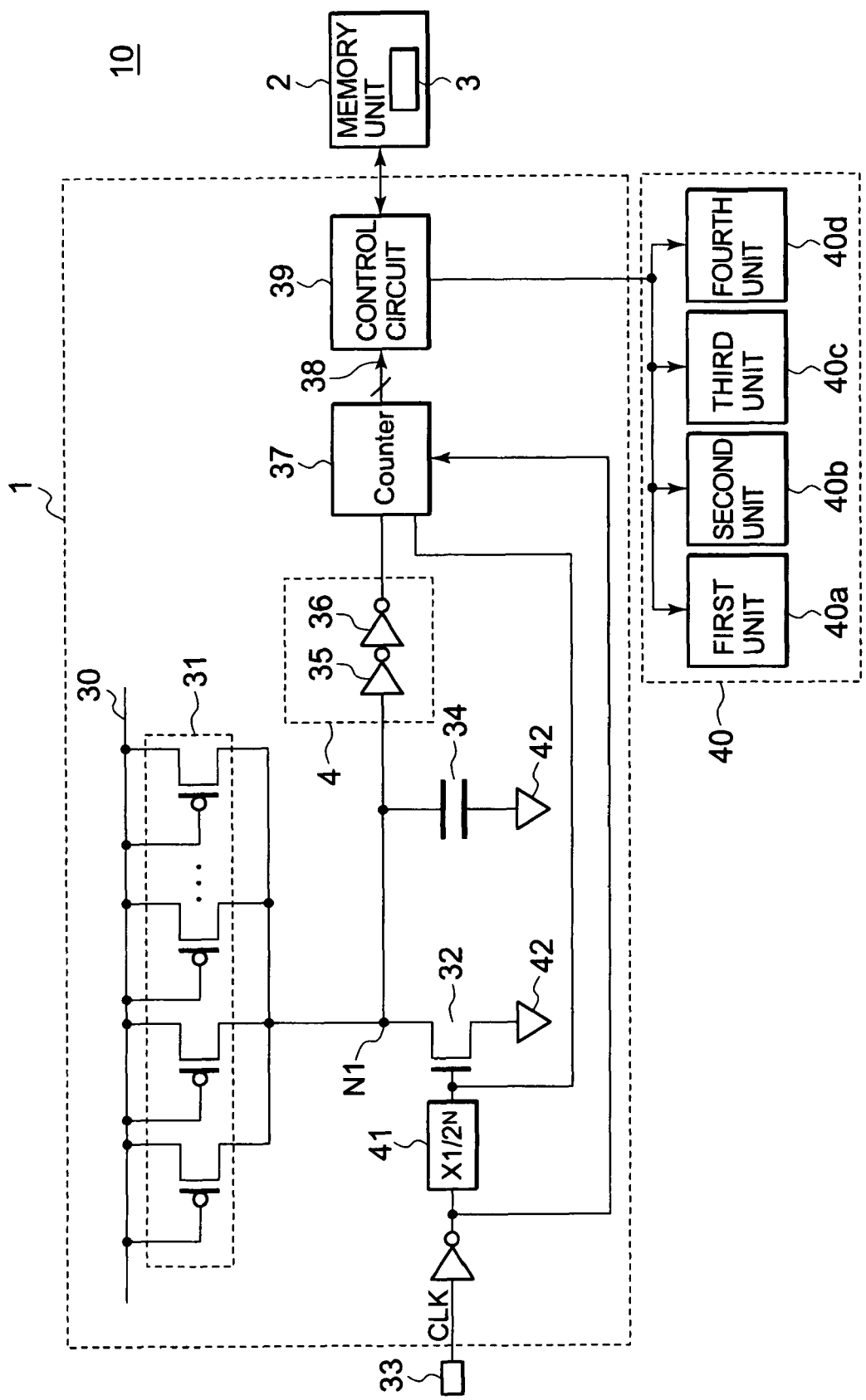
FIG. 4 is an example of a block diagram of an exemplary first embodiment of the present invention.

FIG. 4 is an example of a block diagram of a semiconductor integrated circuit 10 of an exemplary first embodiment.

The semiconductor integrated circuit 10 of the exemplary first embodiment includes a monitor circuit 1, a memory unit 2 including a power supply voltage setting table 3, and a circuit unit 40. The monitor circuit 1 controls the power supply voltage supplied to the circuit unit 40. However, a parameter being controlled by the monitor circuit 1 is not limited to the power supply voltage. For example, the operation frequency or the like of the circuit unit 40 may be controlled by the monitor circuit 1. The circuit unit 40 includes a plurality of units (a first unit 40a, a second unit 40b, a third unit 40c, and a fourth unit 40d). The monitor circuit 1 determines power supply voltage values supplied to the respective units.

The monitor circuit 1 includes a leak current source 31 connected to a power supply 30, a frequency divider 41 receiving a controlling clock CLK supplied by a clock generation circuit 33 to generate a divided clock signal, a control transistor 32, a capacitor 34, a counter control circuit 4, a counter 37 receiving the controlling clock CLK supplied by the clock generation circuit 33, and a control circuit 39 receiving a count value 38 supplied by the counter 37.

The leak current source 31 includes a plurality of P-channel MOS transistors. The frequency divider 41 divides a frequency of a controlling clock CLK to delay a period of the controlling clock CLK. An output terminal of the frequency divider 41 is connected to a gate electrode of the control transistor 32. In addition, the output terminal of the frequency divider 41 is connected to the counter 37.

The control transistor 32 is configured by an N-channel MOS transistor. The control transistor 32 controls the measurement period for measuring the current (leak current) supplied by the leak current source 31. A grounding terminal of the control transistor 32 is connected to a grounding line 42. A power supply terminal of the control transistor 32 is connected to a leak current source 31 through a node N1.

A grounding terminal of the capacitor 34 is connected to the grounding line 42. A power supply terminal of the capacitor 34 is connected to the leak current source 31 through the node N1. The capacitor 34 charges and discharges according to a current which is supplied through the node N1. A first inverter 35 of the counter control circuit 4 senses that an amount of charge of the capacitor 34 reaches the Vth (i.e., a threshold voltage) or higher value. A second inverter 36 of the counter control circuit 4 transmits a signal, which is sensed by the first inverter 35, to the counter 37.

The counter 37 counts a time which is taken from when the capacitor 34 discharges until when the charge amount of the capacitor 34 reaches the Vth. The counter 37 outputs the result of counting the time as a count value 38. The control circuit 39 receives the count value 38 to determine an optimum power supply voltage value for the respective units (the first unit 40a to the fourth unit 40d) of the circuit unit 40 or a chip, based on the count value 38.

Figure 5:
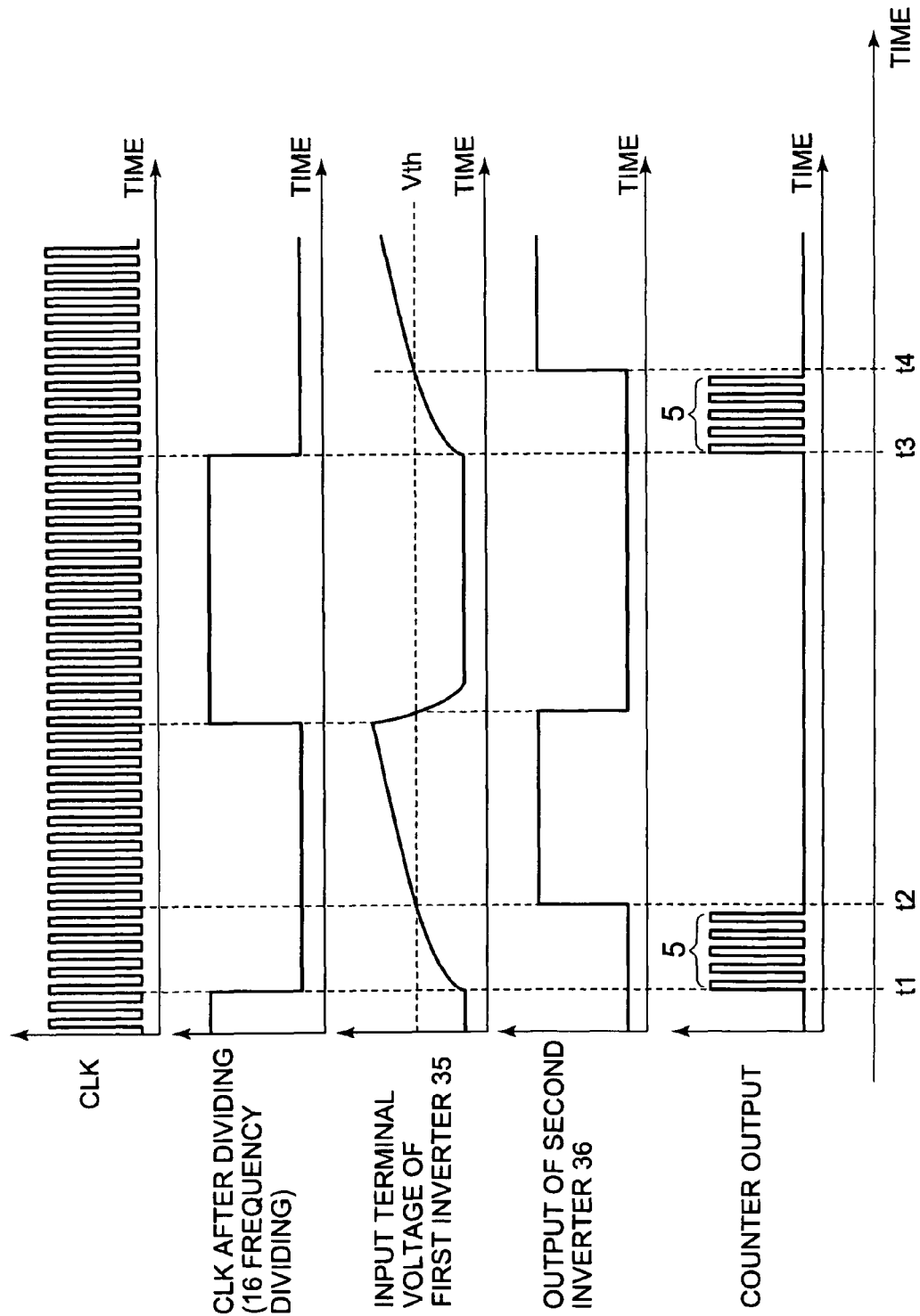
FIG. 5 is an example of a timing chart of the exemplary first embodiment of the present invention.

FIG. 5 is an example of a timing of the exemplary first embodiment. The "CLK" in FIG. 5 is a waveform chart of the controlling clock CLK. The "CLK AFTER DIVIDING" in FIG. 5 is a waveform chart of the dividing clock being output from the frequency divider 41. The "INPUT TERMINAL VOLTAGE OF FIRST INVERTER" in FIG. 5 is a waveform chart of an input terminal of the first inverter 35. The "OUTPUT OF SECOND INVERTER" in FIG. 5 is a waveform chart of outputs of the second inverter 36. The "COUNTER OUTPUT" in FIG. 5 is a waveform chart of outputs of the counter 37.

The leak current source 31 includes a deactivated PMOS transistor. In other words, the gate terminal of the PMOS transistor is off. The leak current source 31 supplies a current, which is supplied from the power supply 30 and corresponds to the leak current of the PMOS transistor, to the node N1.

The activated control transistor 32 is deactivated according to a dividing clock (e.g., a divided clock signal) being output from the frequency divider 41 at "t1". In other words, the control transistor 32 switches from the ON state to the OFF state according to the dividing clock. In the case where the control transistor 32 is deactivated (in the case of the OFF state), the capacitor 34 is charged corresponding to the current flowing into the node N1. As the capacitor 34 is being charged, the voltage applied to the input terminal of the first inverter 35 of the counter control circuit 4 increases.

The level of the output of the first inverter 35 is High in the initial state. When the voltage which is applied to the input terminal of the first inverter 35 exceeds the threshold value Vth at "t2", the output of the first inverter 35 shifts from the High level to the Low level. The threshold value Vth is normally around half the power supply voltage, for example. At "t2", the input terminal of the second inverter 36 becomes a Low level. Accordingly, the output of the second inverter 36 shifts from the Low level to the High level at "t2".

The counter 37 starts a counting operation when the activated control transistor 32 is deactivated. The counter 37 stops the counting operation when the output of the second inverter 36 becomes the High level.

In FIG. 5, the counter 37 starts counting operation at "t1". The counting operation is stopped at "t2". In addition, as shown in FIG. 5, the counter 37 starts the counting operation at "t3" and stops the counting operation at "t4". Accordingly, the counter 37 measures a time required for charging the capacitor 34 as the count value 38.

When the control transistor 32 is activated (in the case of an ON state), the current from the leak current source 31 flows into the grounding line 42 through the control transistor 32. Therefore, the capacitor 34 is not charged. When the control transistor 32 is activated in the case where the charges are accumulated in the capacitor 34, the charges in the capacitor 34 are discharged through the control transistor 32 to the ground line 42.

The control transistor 32 is controlled with the dividing clock generated based on the controlling clock CLK. However, the control transistor 32 may be controlled with the controlling clock CLK. When the dividing clock is at the Low level, the control transistor 32 is deactivated (establishes the OFF state). When the controlling clock CLK is at a High level, the control transistor 32 is activated (establishes the ON state). When the dividing clock is at the Low level, the counter 37 starts the counting operation. Concurrently, the leak current of the leak current source 31 is charged to the capacitor 34. The counter 37 measures a time required for charging the capacitor 34, and stops the counting operation when the charging is completed and the output of the second inverter 36 is at the High level.

The count value 38 measured by the counter 37 is retained such as by a latch circuit (not illustrated in the drawing). When the dividing clock is at the High level, the counter 37 stops the counting operation without depending on the output value of the second inverter 36. When the dividing clock is at the High level, the capacitor 34 is discharged through the control transistor 32 to establish a reset state. At the time, the count value 38 retained by the latch circuit is read by the control circuit 39. The control circuit 39 refers to a power supply voltage setting table 3 retained by the memory unit 2 based on the read count value 38 to check the semiconductor process level of the circuit unit 40. The control circuit 39 determines the power supply voltage of the circuit unit 40 and modifies the power supply voltage or the circuit unit 40.

The PMOS transistor of the leak current source 31 and the circuit unit 40 are made by the same or substantially similar semiconductor process level. Therefore, by checking the semiconductor process level of the leak current source 31, the semiconductor process level of the circuit unit 40 may be determined.

FIG. 6 is an example of a power supply voltage setting table 3. As shown in FIG. 6, the power supply voltage setting table 3 retains a corresponding relation between the count value 38 (shown with a reference number "5" in FIG. 6) and the power supply voltage 6. The delay amount of the circuit unit generally decreases in the case of a transistor with a fast semiconductor process level and, therefore, the circuit unit may include a lot of margin. In the case of a transistor with a slow semiconductor process level, the delay amount of the logic circuit generally becomes large and, therefore, circuit unit may include approximately no margin.

Accordingly, in the case where the count value is large, the transistor property is slow and, therefore, a standard value of the power supply voltage is used (for example, adopting 1 V in the case where 1 V is normal). In the case where the counter value is small, the transistor property is fast and, therefore, a desired performance may be accomplished even if the power supply voltage drops. Thus, a proper power supply voltage is used corresponding to the level such as 0.9 V. With the example in FIG. 6, the count value measured from the time point "t1" to the time point "t2" is "5". Therefore, the power supply voltage is set to 0.85 V. Since the normal state is established with 1.0 V, the power reduction effect may be approximately a 28% reduction in this example.

2. Second Exemplary Embodiment

Figure 7:
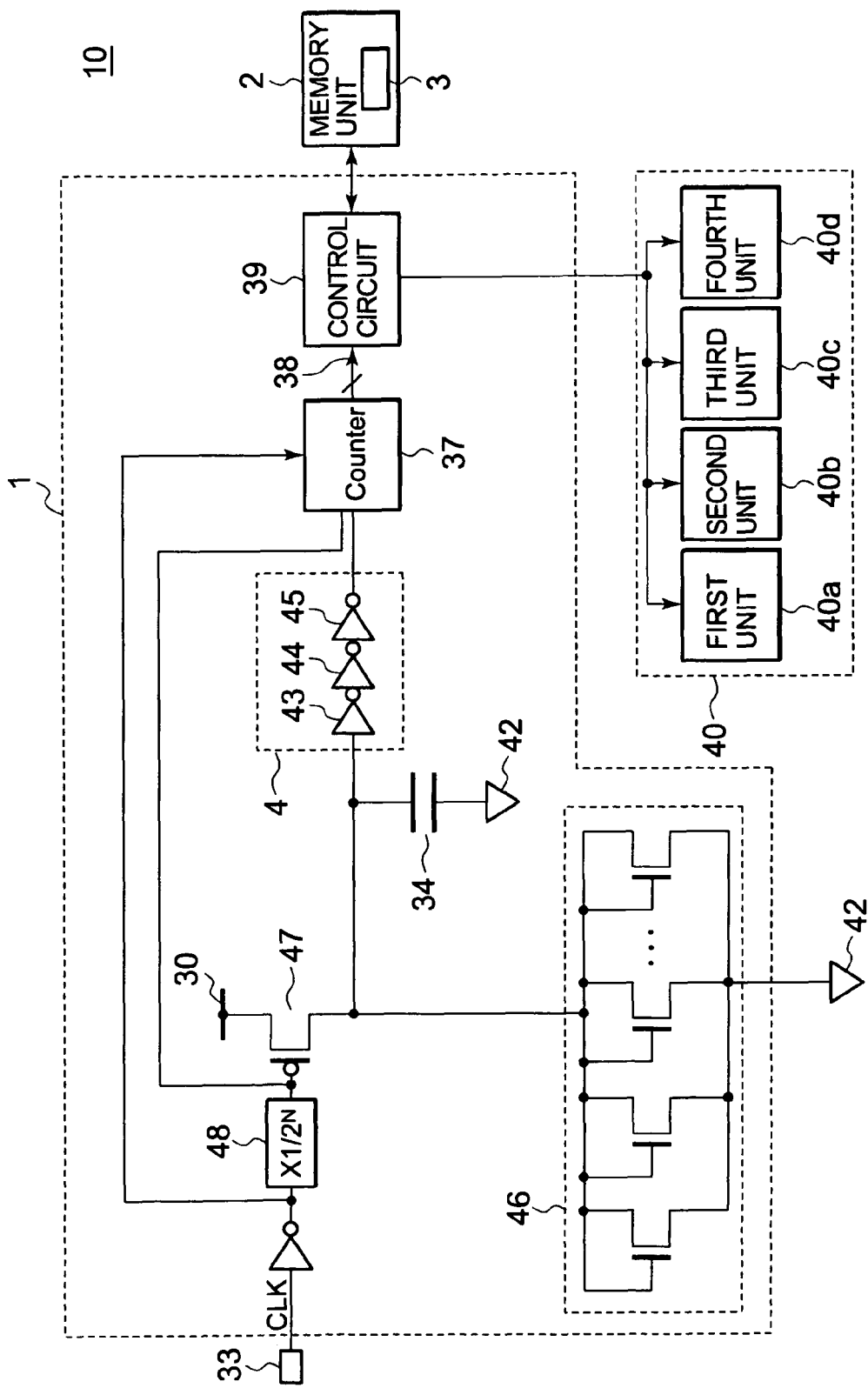
FIG. 7 is an example of a block diagram of an exemplary second embodiment of the present invention.

FIG. 7 is an example of a block diagram of the monitor circuit 1 in a semiconductor integrated circuit 10 of the second exemplary embodiment.

For the above described first exemplary embodiment, the monitor circuit 1 includes a leak current source 31 including a plurality of PMOS transistors and a control transistor 32 configured by an NMOS transistor. The monitor circuit 1 of the second exemplary embodiment includes a current source 46 including a plurality of NMOS transistors and a control transistor 47 configured by a PMOS transistor. In addition, the counter control circuit 4 includes three inverters, and specifically inverter 43, inverter 44 and inverter 45.

In the monitor circuit 1 of the second exemplary embodiment, the counter 37 measures a time until the charges in the capacitor 34 are discharged to a predetermined value (i.e., Vth). A frequency divider 48 generates a dividing clock based on the controlling clock CLK similarly to the first exemplary embodiment.

Figure 8:
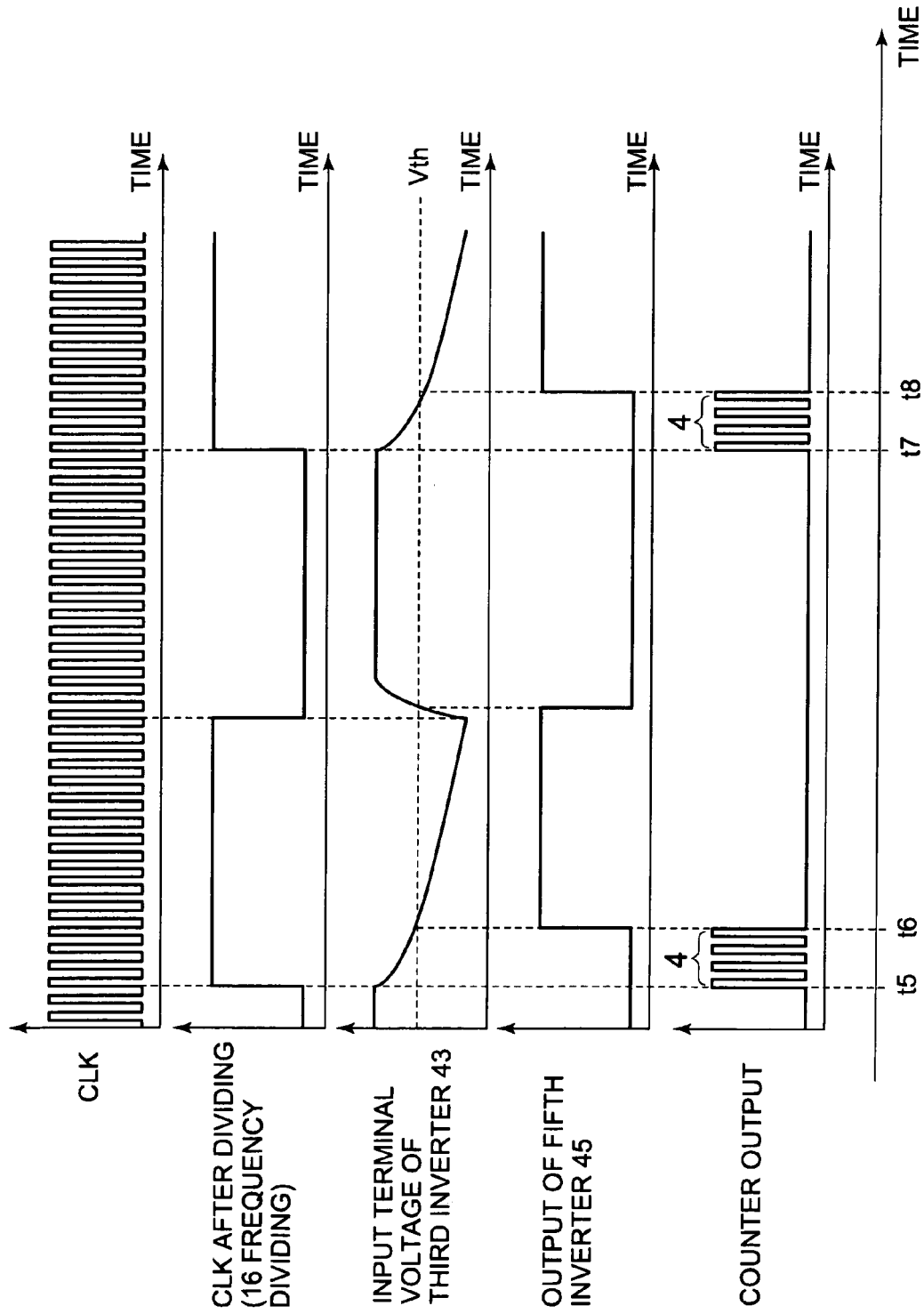
FIG. 8 is an example of a timing chart of the exemplary second embodiment.

FIG. 8 is an example of a timing of the second exemplary embodiment. The counter 37 starts measurement when the dividing clock becomes in the High level (for example, at "t5"). The counter 37 stops measurement when the dividing clock becomes in the Low level. Since the counter control circuit 4 includes the inverter 43, the inverter 44 and the inverter 45, the counter 37 measures time until the output of the inverter 45 of the counter control circuit 4 becomes the High level. If the circuit operation of the counter 37 is adjusted, addition of the inverter 43 may be become unnecessary.

Subsequent operation of the control circuit 39 and the like may be similar to that of the first exemplary embodiment. With reference to FIG. 8, the count value 38 is "4", for example, and the power supply voltage may be set to 0.85 V. Accordingly, similar to the monitor circuit 1 of the first exemplary embodiment, the monitor circuit 1 of the second exemplary embodiment may reduce the power consumption.

3. Third Exemplary Embodiment

Figure 9:
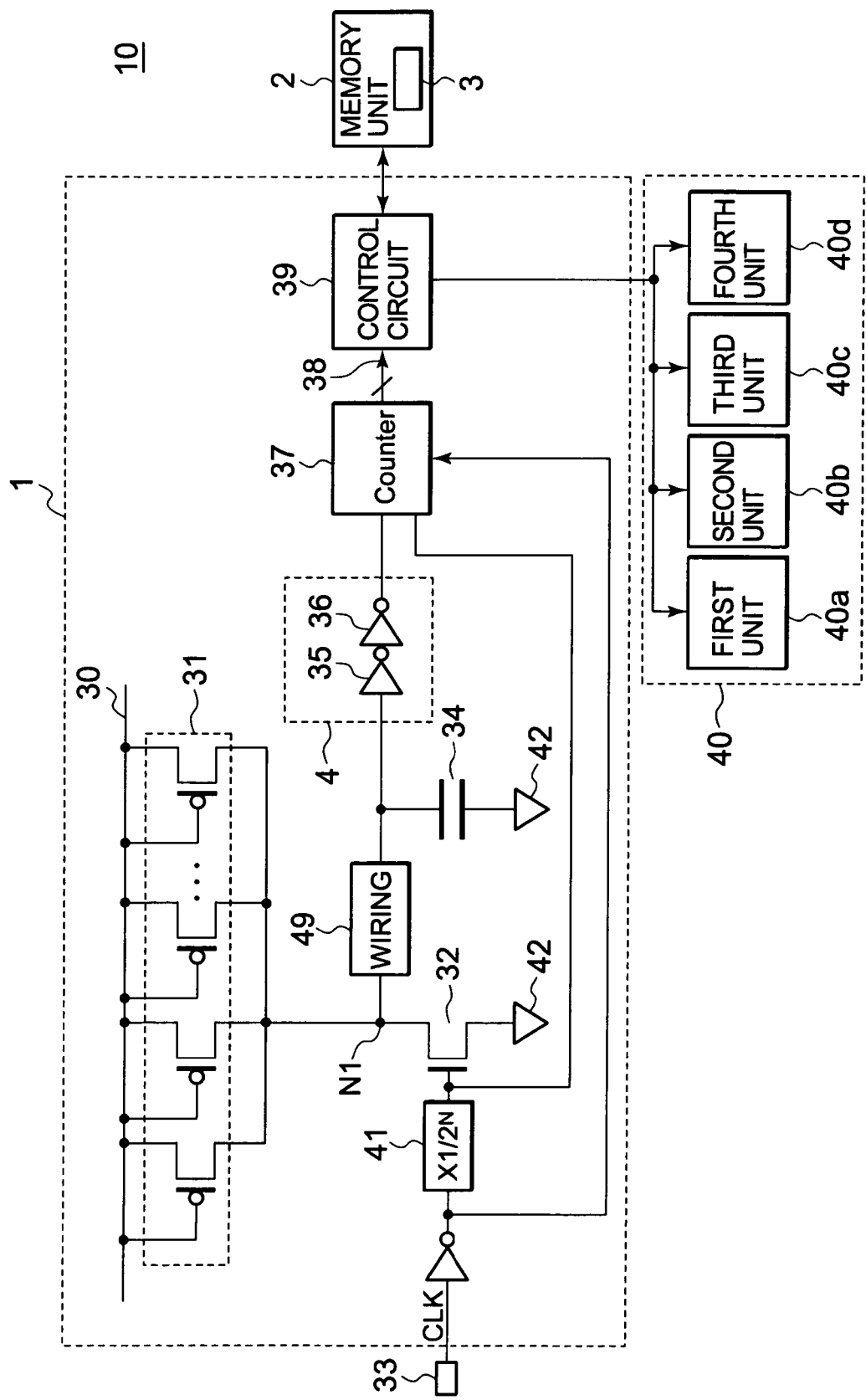
FIG. 9 is an example of a block diagram of an exemplary third embodiment of the present invention.

FIG. 9 is an example of a block diagram of the monitor circuit 1 of the third exemplary embodiment. The monitor circuit 1 of the third exemplary embodiment includes a wiring 49 between a leak current source 31 and a capacitor 34.

The wiring 49 has a wiring length, and thus becomes a resistance. Therefore, a time until when the capacitor 34 is charged with a current varies depending on the resistance of the wiring 49. The semiconductor process variation influences the resistance of the wiring 49. By adding the wiring 49, the monitor circuit 1 of the third exemplary embodiment may observe the semiconductor process variation including the semiconductor process level and the wiring resistance variation.

The wiring resistance correlates to the delay amount. Therefore, the power supply voltage and the clock frequency may be controlled by the count value 38 of the counter 37. In the third exemplary embodiment, the capacitor 34 may be configured by an NWell capacitor similarly to the first and second exemplary embodiments.

Figure 10:
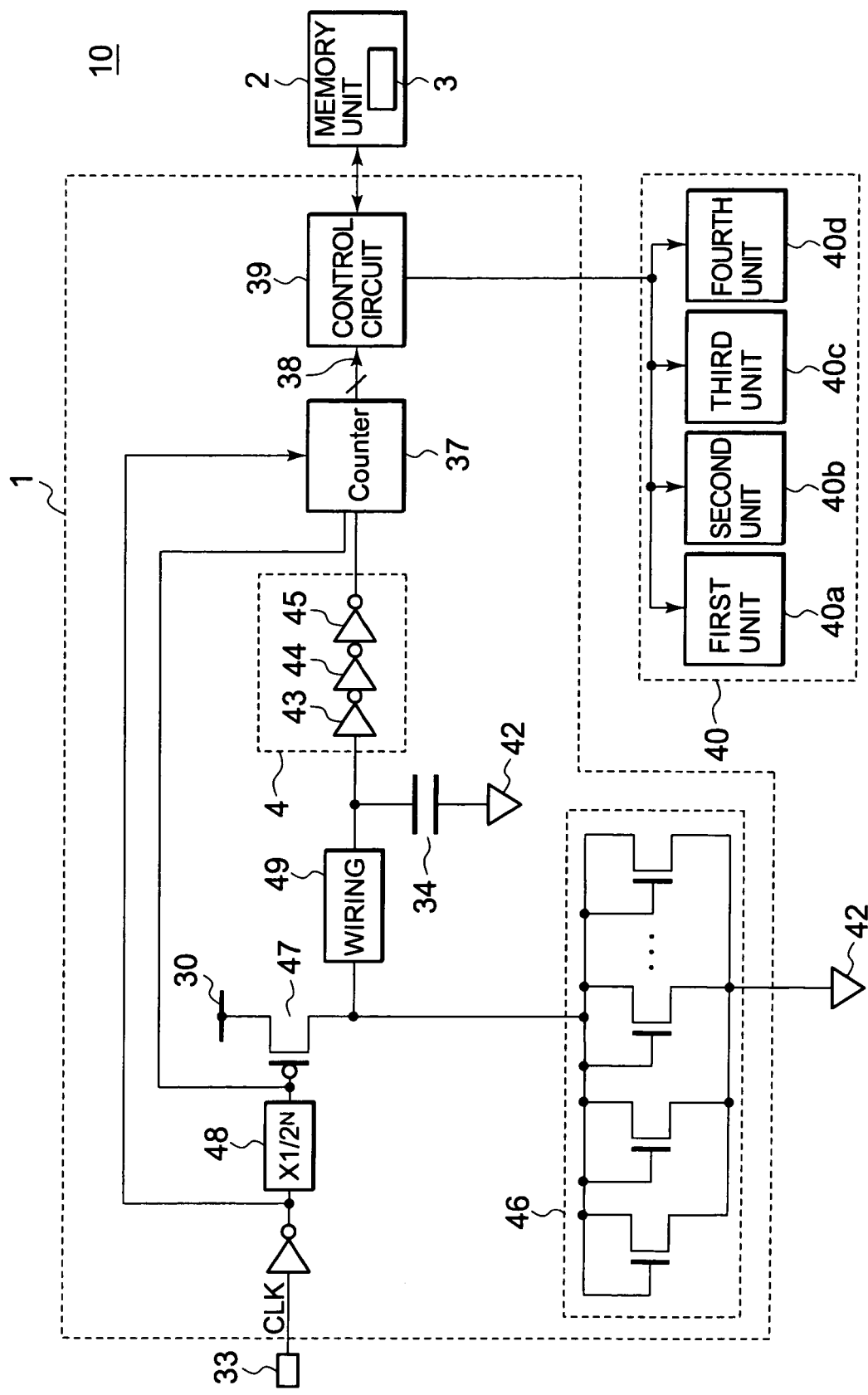
FIG. 10 is an example of a block diagram of the exemplary third embodiment.

FIG. 10 is an example of a circuit diagram of a monitor circuit 1, which includes the wiring 49, including a current source 46 configured by a plurality of NMOS transistors and a control transistor 47 configured by a PMOS transistor. The monitor circuit 1 shown in FIG. 10 may also measure the discharging time similarly to the monitor circuit 1 shown in FIG. 9.

4. Fourth Exemplary Embodiment

Figure 11:
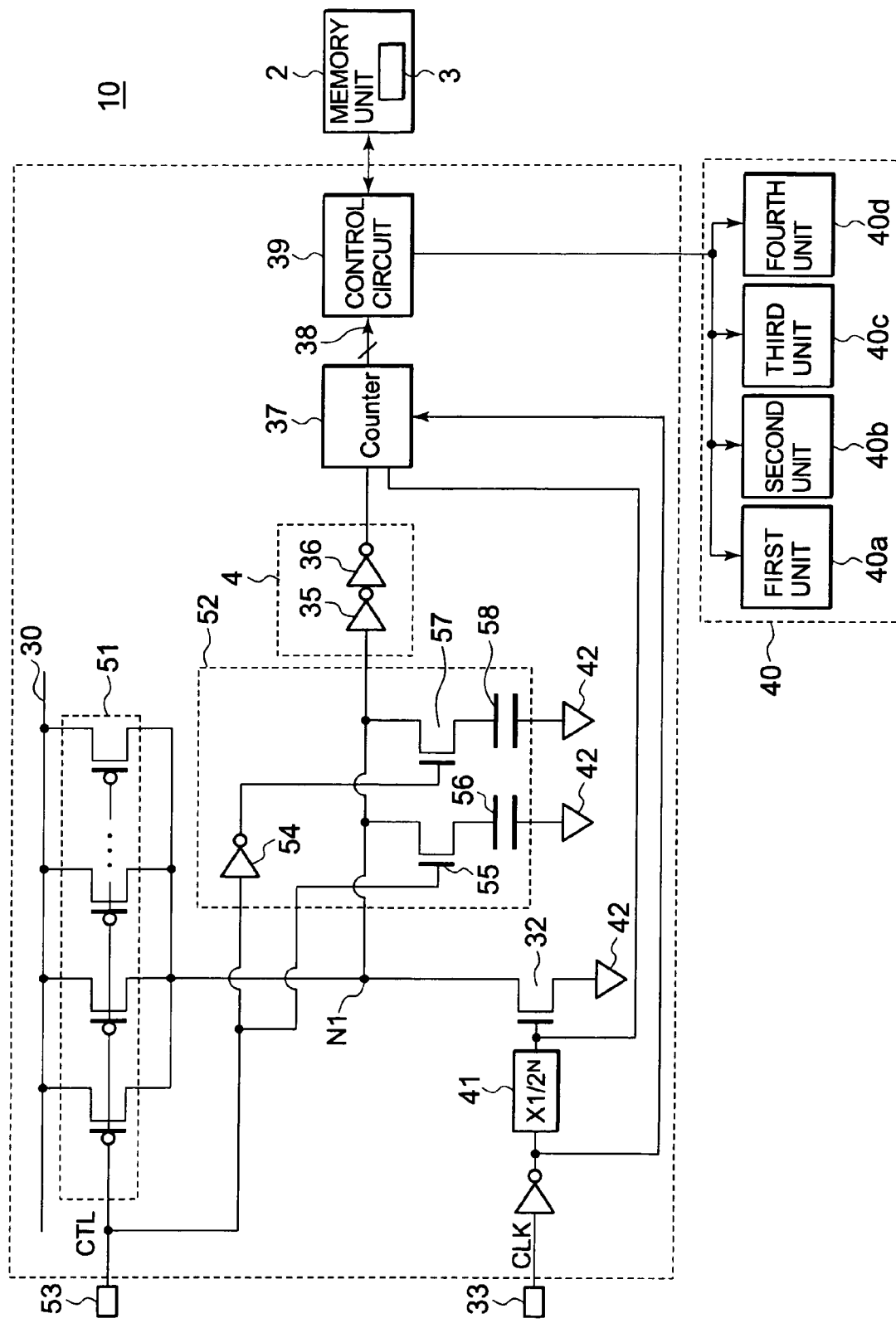
FIG. 11 is an example of a block diagram of an exemplary fourth embodiment of the present invention.

FIG. 11 is an example of a circuit diagram of the monitor circuit 1 of the fourth exemplary embodiment. The monitor circuit 1 of the fourth exemplary embodiment includes a leak current source 51 including a plurality of PMOS transistors connected to the power supply 30, a control signal supply terminal 53 receiving a control signal CTL for switching ON and OFF a plurality of the PMOS transistors and a leak current monitoring unit 52.

The leak current monitoring unit 52 includes an inverter 54 inverting the control signal CTL to output an inverted control signal CTLB, a first NMOS transistor 55 switching ON and OFF according to the control signal CTL, a first capacitor 56 connected to the first NMOS transistor 55, a second NMOS transistor 57 switching ON and OFF according to the inverted control signal CTLB, and a second capacitor 58 connected to the second NMOS transistor 57.

The monitor circuit 1 of the fourth exemplary embodiment includes a control transistor 32, a clock generation circuit 33 receiving a controlling clock CLK and a frequency divider 41 generating a divided clock signal in response to the controlling clock CLK. The control transistor 32 is deactivated at the time of measurement of the leak current and is activated at times other than that of the measurement of the leak current. The capacitors (the first capacitor 56 and the second capacitor 58) are not charged when the transistor 32 is activated, and are discharged via the ground GND (the ground line 42).

When the charges to the first capacitor 56 or the second capacitor 58 exceed the threshold value (Vth) of the first inverter 35, a counter control circuit 4 supplies the second inverter 36 with a signal of the Low level being output from the first inverter 35. The second inverter 36 supplies the counter 37 with a signal of the High level in response to the Low level signal outputted from the first inverter 35. The counter 37 carries out the counting operation according to the counter CLK, and supplies the control circuit 39 with the count value 38 obtained by the counting operation. The control circuit 39 controls the power supply voltage and the CLK frequency to each unit (a first unit 40a to a fourth unit 40d) of the circuit unit 40 based on the count value 38.

As shown in FIG. 11, the leak current source 51 of the fourth exemplary embodiment may carry out switching between the leakage (Ioff) current source and the Ion current source according to the control signal CTL. The Ioff current source may mean that the current is provided from the leak current source 51 when the PMOS transistor is deactivated. And, Ion current source may mean that the current is provided from the leak current source 51 when the PMOS transistor is activated. When the control transistor 32 is switched OFF, the current from the leak current source 51 is charged to the first capacitor 56, or to the second capacitor 58, according to the control signal CTL supplied to the control signal supply terminal 53. Specifically, when the control signal CTL is in the Low level, the leak current source 51 becomes an Ion current source and the second NMOS transistor 57 is switched ON so that the second capacitor 58 is selected. As such, the quantity of the Ion current is measured. When the control signal CTL is in the High level, the leak current source 51 becomes an Ioff current source so that the first NMOS transistor 55 is switched ON and the first capacitor 56 is selected. As such, the quantity of the Ioff current is measured.

For example, in the case of designing the capacitor value of the capacitors 56 and 58, the capacitor value of the second capacitor 58 may be designed to be larger than the capacitor value of the first capacitor 56 by three digits. Thereby, the Ion current may be assumed to be larger than the Ioff current by three digits. In general, the Ion current may be an indication of the delay performance of the transistor. The Ioff current may be an indication of the size (power) of leakage. The Ion current and the Ioff current relate to the semiconductor process level of the chip. Therefore, by assessment with the two indications (i.e., parameters or conditions), a more accurate control of the power supply voltage and the CLK frequency may be accomplished. In the fourth exemplary embodiment, the leak current source 51 may be configured by a current source including a plurality of NMOS transistors. In that case, the P type and the N type of the respective components may be changed in conformity to the leak current source 51. Moreover, by inserting the wiring 49 between the capacitors (the first capacitor 56 and the second capacitor 58) and the leak current source 51, a further more accurate control in consideration of wiring delay may be accomplished.

5. Fifth Exemplary Embodiment

Figure 12:
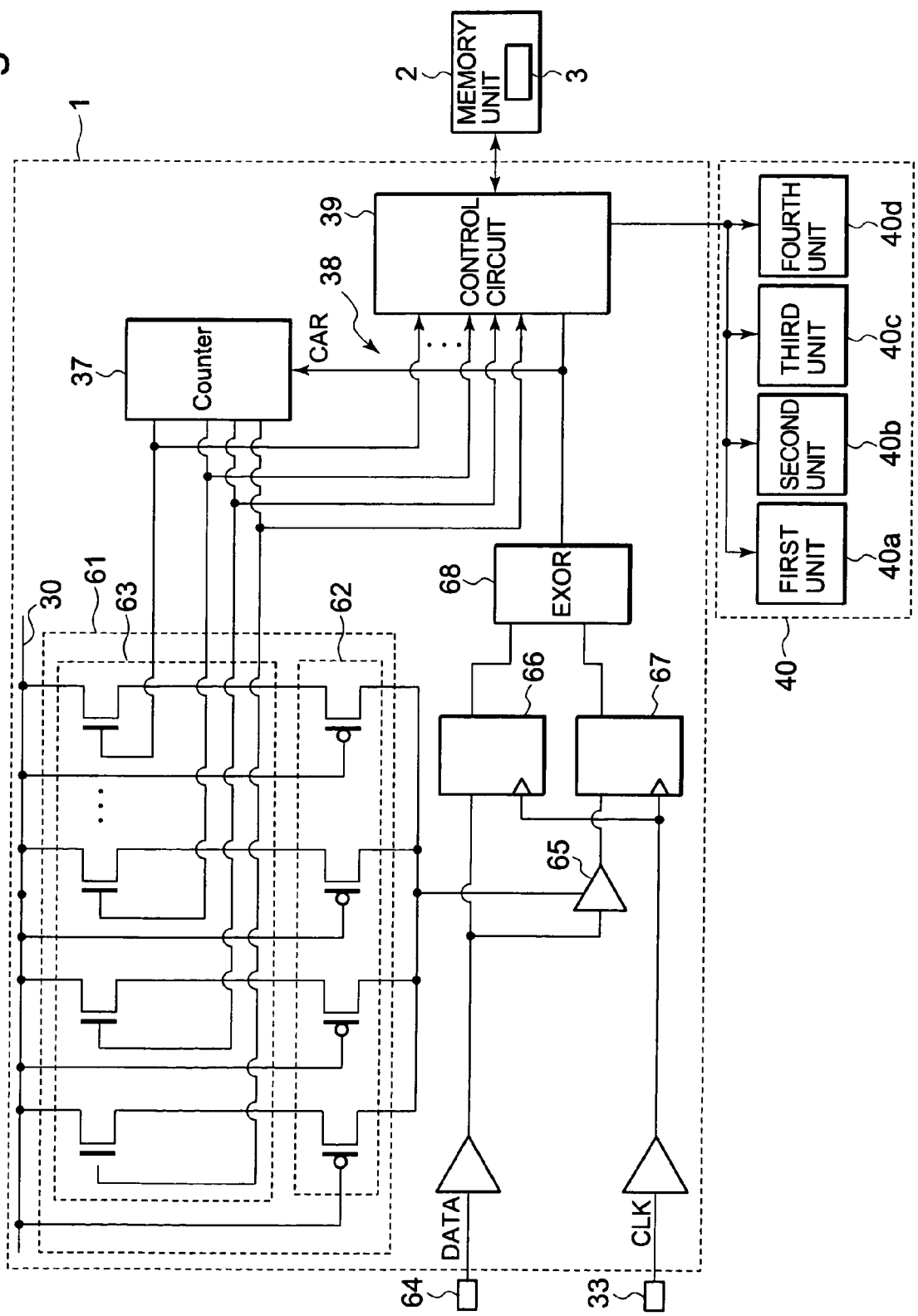
FIG. 12 is an example of a block diagram of an exemplary fifth embodiment of the present invention.

FIG. 12 is an example of a circuit of the monitor circuit 1 of the fifth exemplary embodiment. The monitor circuit 1 of the fifth exemplary embodiment includes a leak current supply unit 61 including a switch group 63 and a leak current source 62, a data supply terminal 64 receiving a data signal DATA, a delay circuit 65, a first Flip Flop 66, a second Flip Flop 67 and an EXOR circuit 68.

The leak current supply unit 61 includes the switch group 63 for switching between a power supply 30 and the leak current source 62. Each of a plurality of NMOS transistors of the switch group 63 is switched between ON and OFF according to the count value 38 of the counter 37.

The current supplied from the leak current source 62 is supplied as a power supply of the delay circuit 65. That is, when the current amount which is provided from the leak current source 62 is small, the power supply of the delay circuit 65 stays low. Therefore, the delay amount of the delay circuit 65 becomes large. On the contrary, when the current amount becomes larger, the delay amount of the delay circuit 65 becomes smaller.

The data signal DATA received by the data supply terminal 64 is supplied to the second Flip Flop 67 via the delay circuit 65. Concurrently, the same data signal DATA is directly supplied to the first Flip Flop 66 without passing through the delay circuit 65. The data signal DATA may be a toggle pattern which repeats "1" and "0".

The outputs of the first Flip Flop 66 and the second Flip Flop 67 are supplied to the EXOR circuit 68. The EXOR circuit 68 carries out an inconsistency detection on the signals. The clock generation circuit 33 provides a clock signal CLK to the first Flip Flop 66 and the second Flip Flop 67. When the EXOR circuit 68 detects an inconsistency between the signals being provided from the FFs 66 and 67, the carry signal CAR becomes a High level, and the counter value 38 is incremented by "1". The initial value of the count value 38 of the counter 37 may be set to "0" in advance. When the counter value 38 increases one-by-one (i.e., incrementally or sequentially) from 0, each of the NMOS transistors of the switch group 63 is switched ON one-by-one so that the current amount supplied from the leak current source 62 is increased. Thereby, the delay amount of the delay circuit 65 may be gradually set smaller.

In the initial stage, the delay amount of the delay circuit 65 is large and the EXOR circuit 68 keeps outputting a signal indicating inconsistency. However, if the number of NMOS transistors being switched ON in the switch group 63 increases, the leak current source 62 sequentially gets larger and the EXOR circuit 68 may no longer detect inconsistency when the delay amount of the delay circuit 65 gets appropriately small. At that time, the EXOR circuit 68 outputs a Low level signal. Then, the control circuit 39 reads the count value 38 of the counter 37, and controls the power supply voltages and the CLK frequencies of the respective units (the first unit 40a to the fourth unit 40d) of the circuit unit 40 according to the count value 38.

A large difference in the Ioff current amount of the leak current source 62 may be occur depending on the semiconductor process level of the chip. Therefore, by reading the count value 38, it may be determined by an optimum count value 38 that the leak current source 62 may supply a sufficient current.

In the fifth exemplary embodiment, the leak current source 62 may be a current source including a plurality of NMOS transistors. In that case, the P type and the N type of the respective components may be changed in conformity with the leak current source 51. Moreover, by inserting the wiring 49 between the delay circuit 65 and the leak current source 62, a more accurate measurement may be accomplished.

In a plurality of exemplary embodiments described above, the monitor circuit 1 adjusts the power supply voltage to be supplied to the circuit unit 40. The monitor circuit 1 may adjust the clock frequency supplied to the core logic part of the circuit unit 40 (or a chip) instead of adjusting its power supply voltage. In addition, the power supply voltage and the clock frequency both may be adjusted. Moreover, the monitor circuit 1 may adjust other parameters.

In the case of controlling each chip instead of controlling each unit of the circuit unit 40, for determining the semiconductor process level, the chip may be tested by a tester at the chip test (e.g., LSI test). Thereby, the power supply voltage and the clock frequency of the chip being tested may be regulated. In that case, the same power supply voltage and the same clock frequency may be regulated for the chips which have the same semiconductor process level.

In addition, after arranging the monitor circuit 1 in the system, the semiconductor process level may be managed in advance for each chip to control the clock frequency and the power supply voltage. In that case, the count value may be ead when the system including the monitor circuit 1 is booting up, and the optimum clock frequency and the power supply voltage may be set for the system.

In the above described exemplary embodiment, the controlling clock CLK is used by dividing a frequency thereof by the frequency divider 41. The period of the controlling clock CLK depends on a duration for completion of charging from the leak current source to the capacitor 34.

By using the NWell capacitor for the capacitor 34, a variation of the capacitor may be reduced. The variation of the capacitor may be a cause of an error for the variation of the semiconductor process level being monitored by the leak current. Therefore, by reducing the variation of the capacitor, the error may be reduced.

The gate length of the transistor configuring the leak current source may be a thick gate length so as to be hardly influenced by the variation of the semiconductor process level being monitored by the leak current. In addition, the number of transistors of which the leak current source may be configured depends on the semiconductor process of the chip being monitored by the technique of the present invention. Therefore, a number of the transistors of the leak current source may be determined based on the semiconductor process of the chip being monitored by the technique of the present invention.

Further, it is noted that Applicant's intent is to encompass equivalents of all claim elements, even if amended later during prosecution.

What is claimed is:

1. An apparatus, comprising:
a current source;
a current monitor circuit which monitors a current amount of the current source, and outputs a current amount signal corresponding to the current amount being monitored;
a counter circuit which counts a count value based on the current amount signal, the count value corresponding to a period being taken until when the current amount reaches a predetermined value;
a control circuit which modifies an operation parameter for operating a circuit unit according to the count value;
wherein the current monitor circuit comprises:
a capacitor which stores a charge provided from the current source;
a switching circuit which switches between storing the charge to the capacitor and discharging the charge from the capacitor, according to a clock signal; and
a counter control circuit which halts the counter circuit from counting the count value when an amount charged in the capacitor reaches the predetermined value.

2. The apparatus according to claim 1, wherein the capacitor is connected to the current source via a connection node, and
wherein the switching circuit connects the connection node to a ground when the clock signal is on, and disconnects the connection node from the ground when the clock signal is off.

3. The apparatus according to claim 1, wherein a wiring is arranged between the current source and the capacitor, and
wherein the wiring is configured in a semiconductor process similar to that with the circuit unit.

4. A method, comprising:
monitoring a current amount of a current source;
outputting a current amount signal corresponding to the current amount being monitored;
counting a count value based on the current amount signal, the count value corresponding to a period being taken until when the current amount reaches a predetermined value;
modifying an operation parameter for operating a circuit unit according to the count value;
storing a charge provided from the current source to a capacitor;
switching between storing the charge to the capacitor and discharging the charge from the capacitor, according to a clock signal; and
halting to count the count value when an amount charged in the capacitor reaches the predetermined value.

5. The method according to claim 4,
wherein the capacitor is connected to the current source via a connection node, said method further comprising:
connecting the connection node to a ground when the clock signal is on, and disconnecting the connection node from the ground when the clock signal is off.

6. The method according to claim 4, wherein the capacitor is connected to the current source via a connection node, said method further comprising:
connecting the connection node to a ground when the clock signal is off, and disconnecting the connection node from the ground when the clock signal is on.

* * * * *